United States Patent
Kawakami et al.

(10) Patent No.: US 7,926,698 B2
(45) Date of Patent: *Apr. 19, 2011

(54) SPOT HEAT WIREBONDING

(75) Inventors: Norihiro Kawakami, Oita-Ken (JP); Yoshikatsu Umeda, Oita-ken (JP); Sohichi Kadoguchi, Oita-ken (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/703,262

(22) Filed: Feb. 10, 2010

(65) Prior Publication Data

US 2010/0140327 A1      Jun. 10, 2010

Related U.S. Application Data

(63) Continuation of application No. 11/120,773, filed on May 3, 2005, now Pat. No. 7,677,432.

(51) Int. Cl.
*B23K 31/02* (2006.01)
*B23K 1/06* (2006.01)

(52) U.S. Cl. ............... 228/180.5; 228/4.5; 228/110.1

(58) Field of Classification Search .................. None
See application file for complete search history.

(56) References Cited

U.S. PATENT DOCUMENTS

| 4,315,128 | A | * | 2/1982 | Matcovich et al. | 219/85.16 |
| 4,821,944 | A | * | 4/1989 | Tsumura | 228/110.1 |
| 5,957,371 | A | * | 9/1999 | Miyano et al. | 228/180.5 |
| 6,031,216 | A | * | 2/2000 | Singh et al. | 219/633 |
| 2002/0027151 | A1 | * | 3/2002 | Arakawa | 228/4.5 |
| 2002/0027152 | A1 | * | 3/2002 | Ushiki et al. | 228/4.5 |
| 2006/0219754 | A1 | * | 10/2006 | Clauberg et al. | 228/4.5 |

FOREIGN PATENT DOCUMENTS

JP      5-226402 A  *  9/1993

* cited by examiner

*Primary Examiner* — Kiley Stoner
(74) *Attorney, Agent, or Firm* — Yingsheng Tung; Wade J. Brady, III; Frederick J. Telecky, Jr.

(57) ABSTRACT

Methods and systems are disclosed for forming secure wirebonds between electrical contacts in electronic device assemblies. Representative embodiments of the invention are described for forming a wirebond including system components and method steps for generating electromagnetic energy from a heat source and transmitting heat to a ball formed on a bondwire. Subsequently, pressure applied to the ball at the bonding site is used in the formation of a wirebond.

8 Claims, 3 Drawing Sheets

SPOT HEAT WIREBONDING

This is a continuation of application Ser. No. 11/120,773 filed May 3, 2005, the contents of which are incorporated by reference in its entirety.

TECHNICAL FIELD

The invention relates to the manufacture of semiconductor devices. More particularly, the invention relates to methods and systems for forming wirebonds useful for assembling semiconductor devices.

BACKGROUND OF THE INVENTION

In order to facilitate electrical connections among semiconductor device terminals and external leads, wirebonds are formed by coupling a bondwire to a bonding site. Generally a bondwire is positioned at a bonding site, such as a bond pad on a chip or PCB, while various forces are applied to cause the metals of the wire and bond pad to fuse. The bondwire is usually made of gold, although bondwires of other metals such as aluminum or copper are also used in the semiconductor manufacturing industry. Ball bonding is a common wirebond process. For the purpose of providing context and example, gold ball bonding is discussed herein, although the invention may also be practiced with ball bonding using other materials. During gold ball bonding, a generally spherical or other shape gold nodule, frequently called a "ball" is formed by melting the end of a gold bondwire held by a part of a bonding tool known as a capillary. Capillaries known in the art are typically ceramic axially symmetrical tools with vertical feedholes for feeding the bondwire through the center. Capillaries commonly hold and control the bondwire during the bonding process and are used to exert pressure and transmit ultrasonic energy to the bonding location.

The ball is brought into contact with the bond pad. A controlled amount of pressure is then applied by the capillary for a selected amount of time, contributing to the formation of a metallurgical weld between the bondwire and the bond pad as well as deforming the ball into its final shape. The application of pressure interacts with the application of ultrasonic energy as further discussed below. The wirebonding tool severs the wire in preparation for the next wirebond by clamping the wire and raising the capillary. Problems are sometimes encountered in the application of pressure to form the bond. If the pressure is insufficient, a poor bond can result. Excessive pressure can result in damage to associated circuitry.

Wirebonding requires that the bondwire and bond pad be placed in intimate contact with each other. Better bonds are achieved when contact is enhanced using ultrasonic energy. The ultrasonic energy is applied as the ball at the end of the bondwire is brought into contact with the bond pad by the capillary, exerting pressure to push the ball against the bond pad. The ultrasonic energy applied by the bonding tool abrades the ball of the bondwire against the surface of the bond pad. This abrading action cleans the bond pad of debris and oxides that may be present, exposing a fresh surface of the bond pad useful for forming a secure bond. The continued application of ultrasonic energy also results in mutual deformation of the bondwire and bond pad where they abrade against one another, which can enhance the metallurgical bond. The amount of ultrasonic energy applied must be carefully controlled. Excessive ultrasonic energy can stress the nascent bond, and the application of insufficient ultrasonic energy fails to adequately enhance bonding. The application of insufficient pressure can also inhibit the effective transmission of ultrasonic energy.

When the bondwire and bond pad are made from different metals, such as in the case of wirebonding gold wire to an aluminum bond pad, for example, thermal energy is used to enhance bonding. In effect, heat is used to soften the harder metal, in this example aluminum, to match the hardness of the softer metal, in this example gold. In order to reach the required temperature, heat is applied to the bond pad by heating the underlying surface, such as a PCB. Insufficient heat can inhibit bonding, while excessive heat can result in damage to the circuitry. Some configurations, such as overhangs or stacked die assemblies present particular problems in directing an acceptable amount of heat to the bonding site.

Due to these and other problems, it is desirable to avoid unnecessary heating of devices during wirebonding, to efficiently direct thermal energy to desired locations, and to avoid excessive ultrasonic vibrations. Improved wirebonding techniques and systems adapted to provide one or more of these or similar benefits would be useful and advantageous in the arts.

SUMMARY OF THE INVENTION

In carrying out the principles of the present invention, in accordance with preferred embodiments thereof, preferred embodiments of the invention provide methods and systems for forming secure wirebonds between electrical contacts in semiconductor device assemblies. A method of wirebonding according to the invention includes steps for positioning a bondwire and ball adjacent to a bonding site with a bonding tool, heating the bondwire, ball, and bonding tool, and then placing the ball in contact with the bonding site.

According to an aspect of the invention, a preferred embodiment of a method of forming a wirebond includes steps for applying electromagnetic energy to heat a ball formed on a bondwire and subsequently applying pressure to the ball at the bonding site.

According to other aspects of the invention, in examples of preferred embodiments, reflected heat is directed to the bondwire, ball, and bonding tool to facilitate bonding.

According to yet another aspect of the invention, a system for wirebonding for use in assembling semiconductor devices includes a bonding tool for positioning a bondwire and ball adjacent to a bonding site and for placing the bondwire and ball in contact with the bonding site. A heat source is operably coupled to a heat conduit for heating the bondwire, ball, and bonding tool prior to the formation of a bond.

According to yet another aspect of the invention, a wirebonding system includes a heat reflector for reflecting heat to the bondwire from a heat source.

According to further aspects of the invention, preferred embodiments of wirebonding systems are disclosed in which a concave heat reflector, such as a mirror, is used to direct heat to bond components.

The invention has advantages including but not limited to improved wirebonding methods and systems that efficiently provide heat where required and reduce unwanted heat transfer. Further advantages are realized in the potential reduction of ultrasonic energy and pressure. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

In general, the invention provides improved wirebonding for the manufacture of integrated circuitry. The preferred embodiments of methods and systems of the invention shown and described by way of example may be used to provide secure wirebonds between electrical contacts of a chip and substrate or leadframe and are particularly useful for forming wirebonds on stress-sensitive or heat-sensitive assemblies, or to bonding sites to which heat does not transmit easily.

Figure 1A:
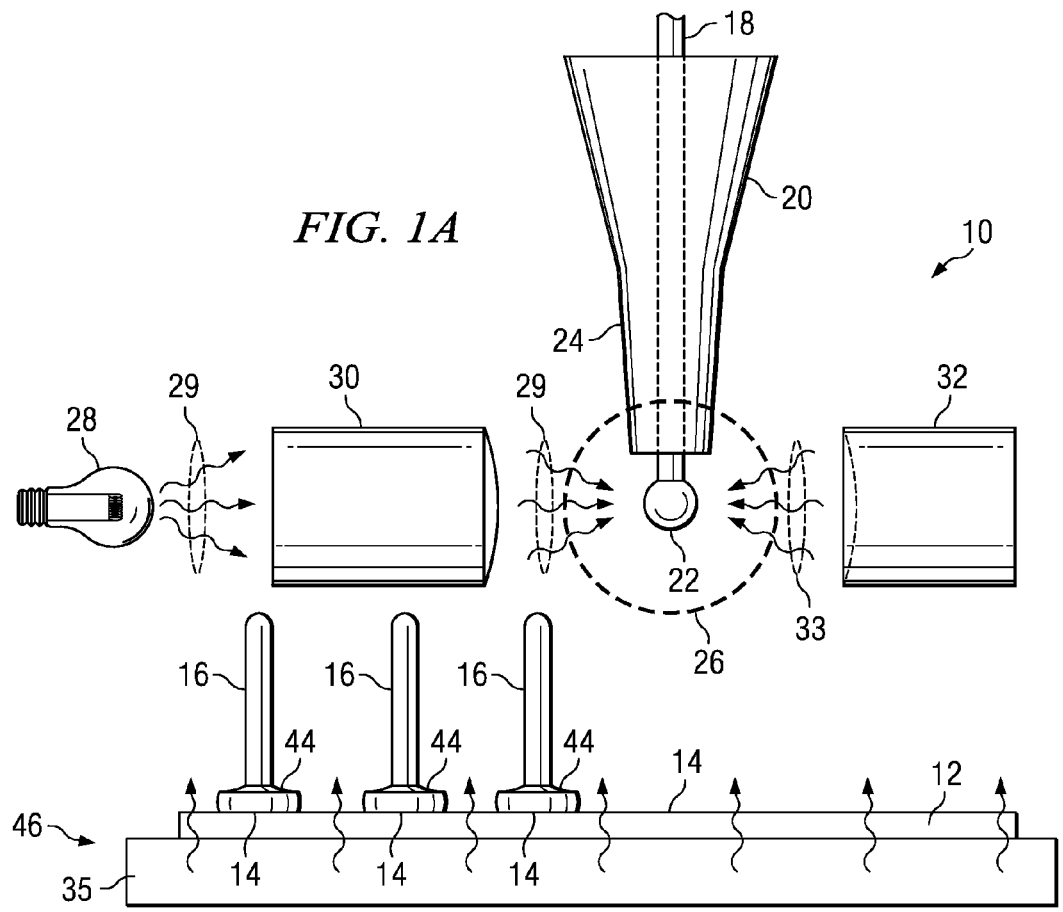
FIG. 1A is a partial side view representing an example of preferred embodiments of systems and method steps for wirebonding according to the invention.

Referring primarily to FIG. 1A, a representative embodiment of systems and methods 10 of wirebonding according to the invention is depicted. A PCB 12 has a number of bonding sites 14 for receiving wires 16 for the purpose of making external electrical connections. An unattached wire 18 is shown held by a capillary 20. The capillary 20 is a tool known in the arts and is a portion of a larger tool used for forming wirebonds. Various equipment may be used for manipulating the unattached wire 18 and PCB 12 within the scope of the invention. The bondwire 18 has a ball 22, which is positioned adjacent to the bonding site 14 with the bonding tool 20 as known in the arts. A selected area including the ball 22 and preferably the tip 24 of the capillary 20 is heated to create a heated area 26 preliminary to bringing the ball 22 into contact with the bonding site 14. As shown, a heat source 28, in this example an electromagnetic heat bulb, is used to produce heat 29 for transmission by a heat conduit 30, for example a fiber optic cable, to the heated area 26. The heat conduit 30 preferably has a lens 31 for focusing the transmitted heat 29 on the selected area 26. A heat reflector 32 is positioned to reflect transmitted heat 33 that initially escapes the heated area 26 back into the heated area 26. As shown in the preferred embodiment 10 of FIGS. 1A and 1B, the heat reflector 32 may be concave. In the presently preferred embodiment, a concave mirror 32 is used, although a flat mirror, or other concave or flat panel of reflective material may also be used.

Figure 1B:
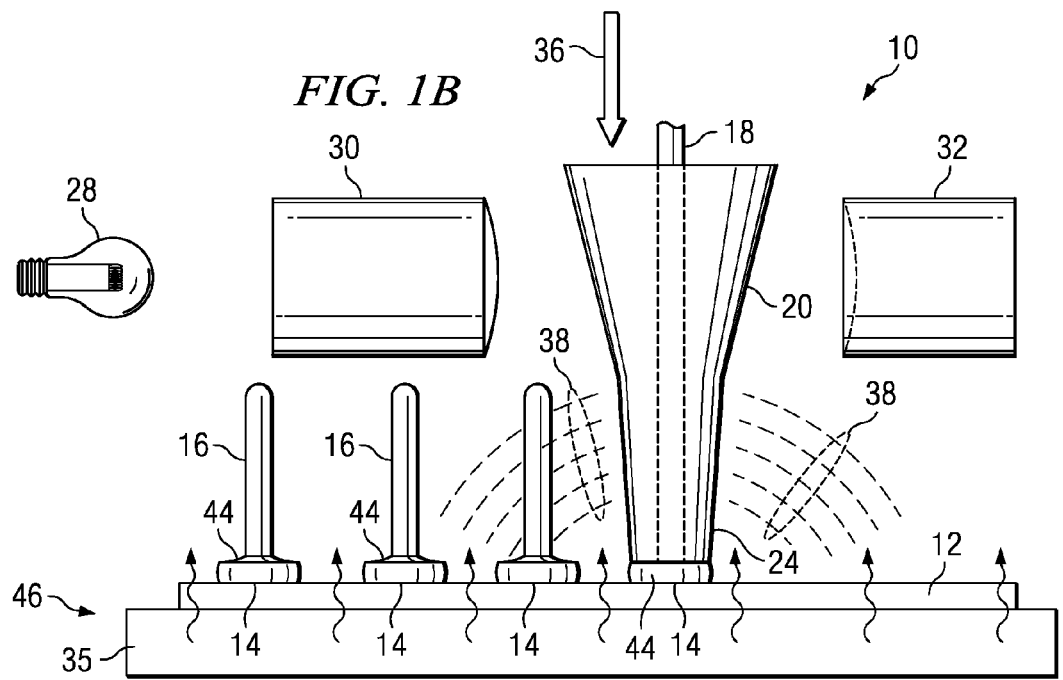
FIG. 1B is a partial side view representing an example of preferred embodiments of systems and further method steps for wirebonding according to the invention.

A contact heat source 35 may also be used to apply heat indirectly to the bonding site 14 as is common in the arts, typically placed in contact with the PCB 12. As shown in FIG. 1B, The previously heated ball 22 is pressed into contact with the bonding site 14, using the bonding tool 20 to apply a predetermined amount of compressing force 36. A predetermined amount of ultrasonic energy 38 is also applied to the ball 22 and bonding site 14 as is known in the art for forming wirebonds. The ball 22 deforms under the pressure of the compressing force 36 producing the final shape of the completed wirebond 44.

It should be appreciated by those skilled in the arts that using the invention, the compressing force 36 used to press on the ball 22, and/or the ultrasonic energy 38 applied to the bonding site 14 and ball 22, may in some instances be reduced from the amount otherwise required. Additionally or alternatively, the duration of the application of the compressing force 36, or ultrasonic energy 38, or both, may be reduced below levels previously known in the arts in some applications without detriment to producing a secure wirebond 44. It should also be understood that heat is applied precisely where needed to promote bonding without making physical contact with the device 46 undergoing assembly.

Figure 2A:
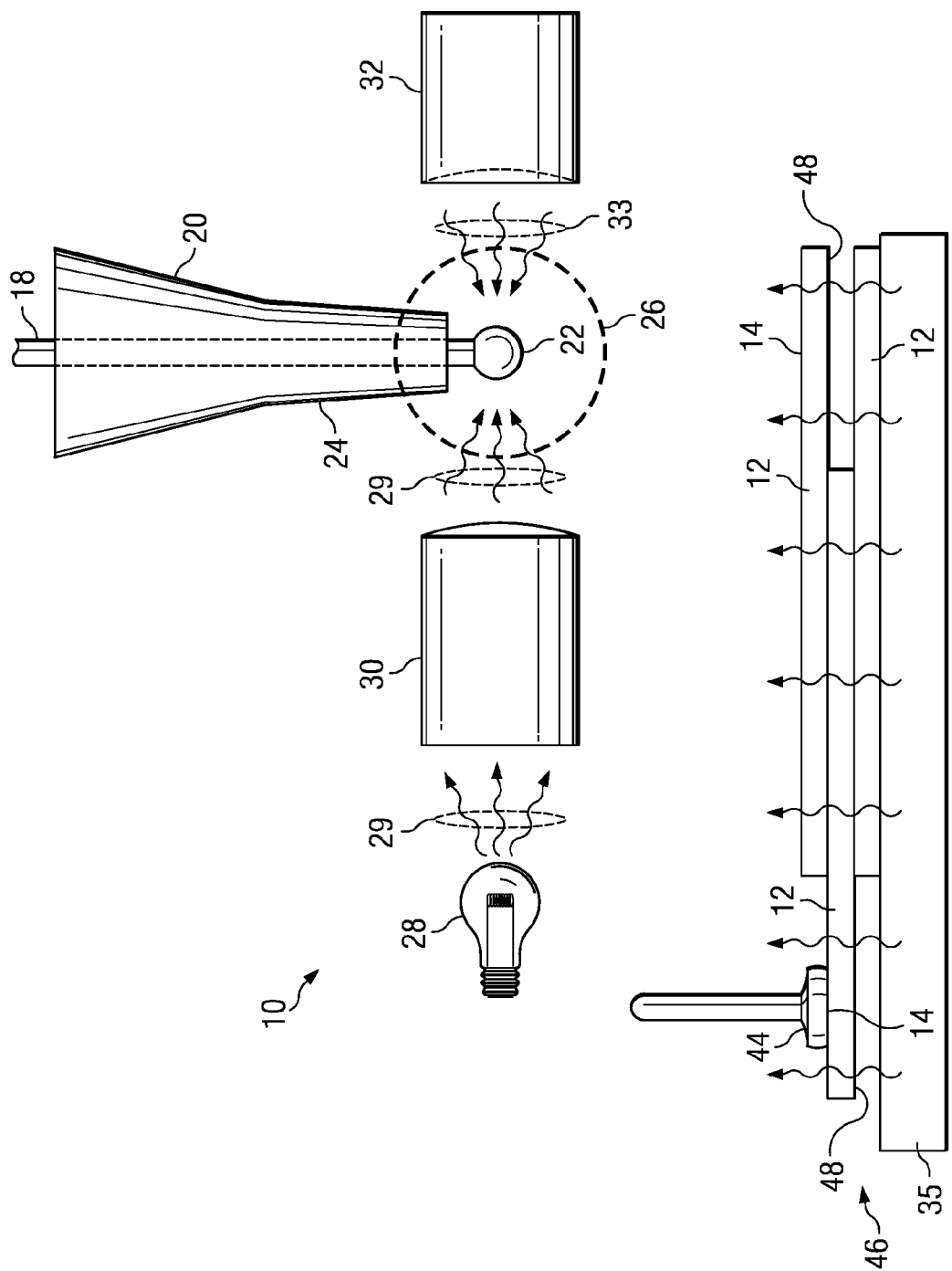
FIG. 2A is a partial side view representing another example of alternative preferred embodiments of systems and method steps for wirebonding according to the invention.
Figure 2B:
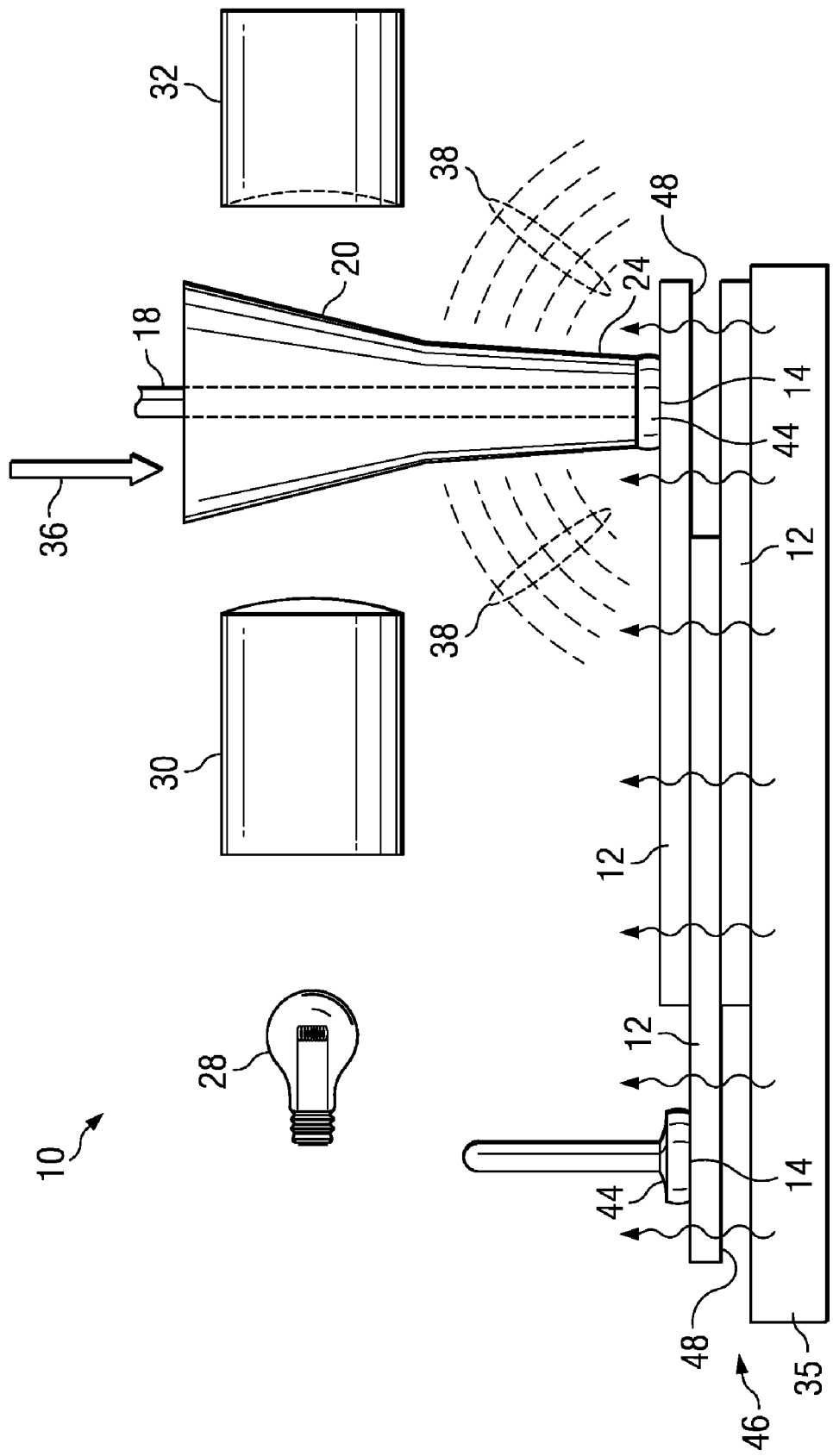
FIG. 2B is a partial side view representing further method steps for wirebonding according to the invention in the example of alternative embodiments.

An alternative depiction of methods and systems 10 for wirebonding in the assembly of semiconductor devices is shown in FIGS. 2A and 2B. The bonding tool 20 is used for positioning a bondwire 18 and ball 22 adjacent to a bonding site 14 and for subsequently placing the ball 22 in contact with the bonding site 14. The ball 22 portion of the bondwire 18 and the tip 24 of the bonding tool 20 are preheated as described by a heat source 28, conduit 30, and reflector 32. Additional heat may be provided by an indirect heat source 35 in contact with the PCB 12. As shown, the semiconductor device 46 may have one or more stacked PCBs 12. Also, one or more of the PCBs 12 may have an overhanging portion 48. It has been found that overhangs 48 may in some instances be less susceptible to heat transmission from an indirect heat source 35, and that overhangs may also be more likely to be damaged by relatively large amounts of ultrasonic energy 38 or compression force 36. The use of the invention as shown and described permits advantageous reductions in the exposure of such overhangs to potential damage.

The methods and systems of the invention provide advantages including but not limited to improved wirebonding in IC packages, avoiding transfer of misplaced or excessive heat to nearby structures, and permitting a reduction in ultrasonic energy required for forming a secure wirebond. While the invention has been described with reference to certain illustrative embodiments, those described herein are not intended to be construed in a limiting sense. Various modifications and combinations of the illustrative embodiments as well as other advantages and embodiments of the invention will be apparent to persons skilled in the arts upon reference to the drawings, description, and claims.

We claim:

1. A method of wirebonding for use in assembling electronic devices comprising the steps of:
   positioning a ball at an end of a bondwire adjacent to but not in contact with a bonding site with a bonding tool;
   transmitting electromagnetic energy for heating the bondwire, ball, and bonding tool; and
   then placing the heated ball in contact with the bonding site using the bonding tool, forming a ballbond on the bonding site.

2. A method according to claim 1 further comprising the step of applying ultrasonic energy to the ball and bonding site.

3. A method according to claim 1 further comprising the step of applying a compressing force to the ball at the bonding site.

4. A method according to claim 1 further comprising the step of applying indirect heat to the bonding site.

5. A method according to claim 1 further comprising the step of applying reflected heat to the ball.

6. A method according to claim 1 further comprising the step of applying reflected heat to the bondwire.

7. A method according to claim 1 further comprising the step of applying reflected heat to the bonding tool.

8. A method according to claim 1 further comprising the step of applying reflected heat to the bonding site.

* * * * *